United States Patent
Yang

(10) Patent No.: US 8,179,719 B1
(45) Date of Patent: May 15, 2012

(54) SYSTEMS AND METHODS FOR IMPROVING ERROR DISTRIBUTIONS IN MULTI-LEVEL CELL MEMORY SYSTEMS

(75) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 419 days.

(21) Appl. No.: 12/401,058

(22) Filed: Mar. 10, 2009

Related U.S. Application Data

(60) Provisional application No. 61/068,760, filed on Mar. 10, 2008.

(51) Int. Cl.
*G11C 11/34* (2006.01)

(52) U.S. Cl. ......... 365/185.03; 365/185.18; 365/185.04; 365/185.09; 365/185.12; 365/185.17; 365/185.23; 365/189.011; 365/189.14; 365/230.04; 365/230.06

(58) Field of Classification Search ............. 365/185.03, 365/185.18, 185.04, 185.09, 185.12, 185.17, 365/185.23, 189.011, 189.14, 230.04, 230.06
See application file for complete search history.

(56) References Cited

U.S. PATENT DOCUMENTS

| | | | |
|---|---|---|---|
| 6,279,133 B1 | 8/2001 | Vafai et al. | |
| 6,501,812 B1 | 12/2002 | Yada | |
| 2007/0067704 A1 | 3/2007 | Altintas et al. | |
| 2007/0171730 A1 | 7/2007 | Ramamoorthy et al. | |
| 2008/0002468 A1* | 1/2008 | Hemink | 365/185.17 |
| 2008/0043527 A1* | 2/2008 | Aritome | 365/185.03 |
| 2008/0181000 A1* | 7/2008 | Lasser | 365/185.03 |
| 2008/0205138 A1* | 8/2008 | Wang et al. | 365/185.03 |
| 2008/0205152 A1* | 8/2008 | Kang | 365/185.18 |

FOREIGN PATENT DOCUMENTS

| | | |
|---|---|---|
| GB | 2 418 820 A | 4/2006 |
| WO | WO2007/132453 A | 11/2007 |

OTHER PUBLICATIONS

The International Search Report and the Written Opinion of the International Searching Authority, or the Declaration mailed Mar. 3, 2009 for International Application No. PCT/US2008/074414 filed Aug. 27, 2008; 13 pages.

* cited by examiner

*Primary Examiner* — Fernando Hidalgo

(57) ABSTRACT

A memory system includes a state set module that provides a first state set having a plurality of states, each being assigned to represent a particular data sequence, and a second state set having a same number of states as the first state set, wherein an assignment of one or more particular data sequences among the states of the second state set is different relative to that set forth in the first state set. The memory system further includes a write module that writes first data to a first multi-level memory cell of the memory system based on the first state set, the first multi-level cell being located on a wordline of the memory system, and that writes second data to a second multi-level memory cell of the memory system based on the second state set, the second multi-level cell being located on the wordline of the memory system.

18 Claims, 9 Drawing Sheets

SYSTEMS AND METHODS FOR IMPROVING ERROR DISTRIBUTIONS IN MULTI-LEVEL CELL MEMORY SYSTEMS

CROSS-REFERENCE TO RELATED APPLICATIONS

This application claims the benefit of U.S. Provisional Application No. 61/068,760, filed on Mar. 10, 2008. The disclosure of the above application is incorporated herein by reference in its entirety.

FIELD

The present disclosure relates generally to semiconductor memory, and more particularly to systems and methods for decreasing bit error rates (BERs) in multi-level cell (MLC) memory systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) typically include memory arrays of one or more dimensions. For example, a two-dimensional memory array includes rows and columns of memory cells that store binary data bits. A memory cell can be a single-level cell (SLC) or a multi-level cell (MLC). A single-level cell may store one of two states that correspond to one bit (e.g., 0 or 1). A multi-level cell may store one of a plurality of states corresponding to two or more bits. For example, a two-bit multi-level cell may store one of four states, in which each state corresponds to two bits (e.g., 00, 01, 10, or 11). The increased storage capacity of multi-level cells may result in a lower overall cost per byte of storage. NAND flash memory and NOR flash memory are examples of memory systems that include multi-level cells.

Referring now to FIG. 1, a portion of a memory array 10 includes, for example, two-bit MLCs 12-0, 12-1, 12-2, 12-3 (collectively referred to as MLCs 12). Each of the MLCs 12 is accessed by a corresponding bit line. For example, bit line 0 may control MLC 12-0 and bit line 1 may control MLC 12-1. Typically, a word line of MLCs may include a plurality of memory pages based on a number of bits per MLC. For example, a word line 14 includes two pages, page 0 and page 1, corresponding to the two-bit storage capacity of each of the MLCs 12.

Memory pages may be described by a corresponding bit significance (e.g., most significant, least significant, etc.). For example, page 0 may correspond to a most significant bit (MSB) in each of the MLCs 12, and page 1 may correspond to a least significant bit (LSB) in each of the MLCs 12. In other words, when one of the MLCs 12 stores a state "01," the MSB (page 0) may be 0 and the LSB (page 1) may be 1.

MLC memory arrays are typically read or written using multiple pass (multi-pass) programming. In other words, one interleaved page of a word line may be read or written during each pass (i.e., R/W (read/write) cycle). For example, in word line 14, page 0 may be written during a first write pass and page 1 may be written during a second write pass.

Referring now to FIG. 2, an example of a memory IC 20 is shown. The memory IC 20 includes a MLC memory array 22, a bit line controller 24, a word line controller 26, and a control module 28. The MLC memory array 22 includes M rows and N columns including (M*N) MLC cells 30. The bit line controller 24 selects N columns of cells 30 via bit lines $BL_0$-$BL_{(N-1)}$. The word line controller 26 selects M rows of cells 30 via word lines $WL_0$-$WL_{(M-1)}$.

The control module 28 includes an address control module 32, a read/write (R/W) control module 34, and an error correction coding (ECC) module 36. The address control module 32 controls addressing of the cells 30 via the bit line controller 24 and the word line controller 26. The R/W control module 34 controls R/W operations of the cells 30. For example, the R/W control module 34 may perform multi-pass programming to write data to the cells 30. The ECC module 36 controls encoding of data written to the cells 30 and decoding (which may also include error correction) of data read from the cells 30.

The memory IC 20 communicates with a host 38 via a bus 40. The bus 40 includes address lines, data lines, and control lines. The host 38 issues R/W and control instructions to the memory IC 20 via the bus 40 when reading and writing data from and to the cells 30, respectively. The control module 28 reads and writes data from and to the cells 30 based on the R/W and control instructions.

SUMMARY

A memory system includes a state set module and a write module. The state set module provides a first state set having a plurality of states, each of the plurality of states of the first state set being assigned to represent a particular data sequence, and a second state set having a same number of states as the first state set, wherein an assignment of one or more particular data sequences among the states of the second state set is different relative to that set forth in the first state set. The write module writes first data to a first multi-level memory cell of the memory system based on the first state set, the first multi-level cell being located on a wordline of the memory system, and writes second data to a second multi-level memory cell of the memory system based on the second state set, the second multi-level cell being located on the wordline of the memory system.

A method includes providing a first state set having a plurality of states, each of the plurality of states of the first state set being assigned to represent a particular data sequence, providing a second state set having a same number of states as the first state set, wherein an assignment of one or more particular data sequences among the states of the second state set is different relative to that set forth in the first state set, writing first data to a first multi-level memory cell of a memory system based on the first state set, the first multi-level cell being located on a wordline of the memory system, and writing second data to a second multi-level memory cell of the memory system based on the second state set, the second multi-level cell being located on the wordline of the memory system.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
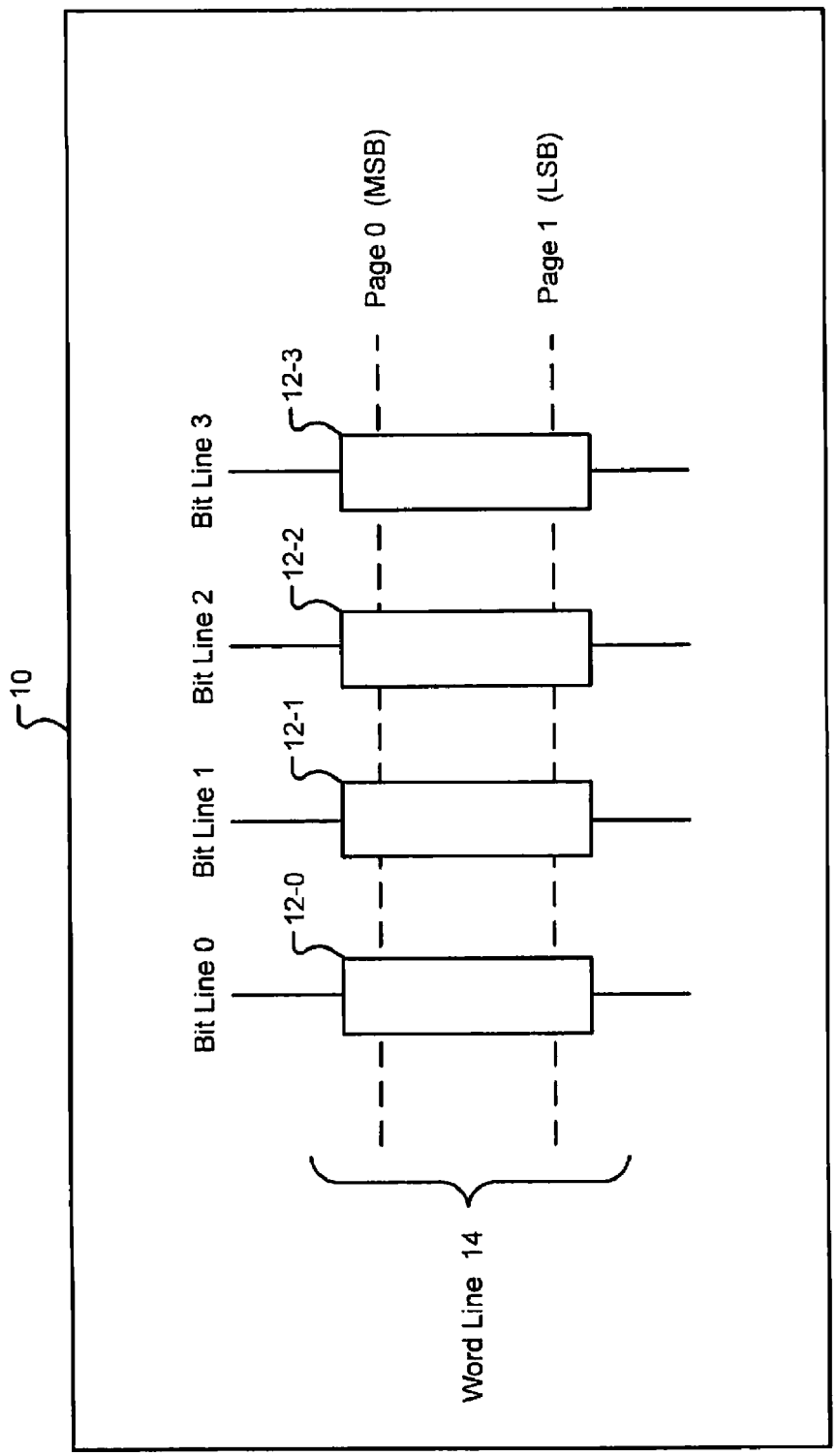
FIG. 1 is a schematic diagram of an example of a multiple-level cell (MLC) memory array according to the prior art.
Figure 2:
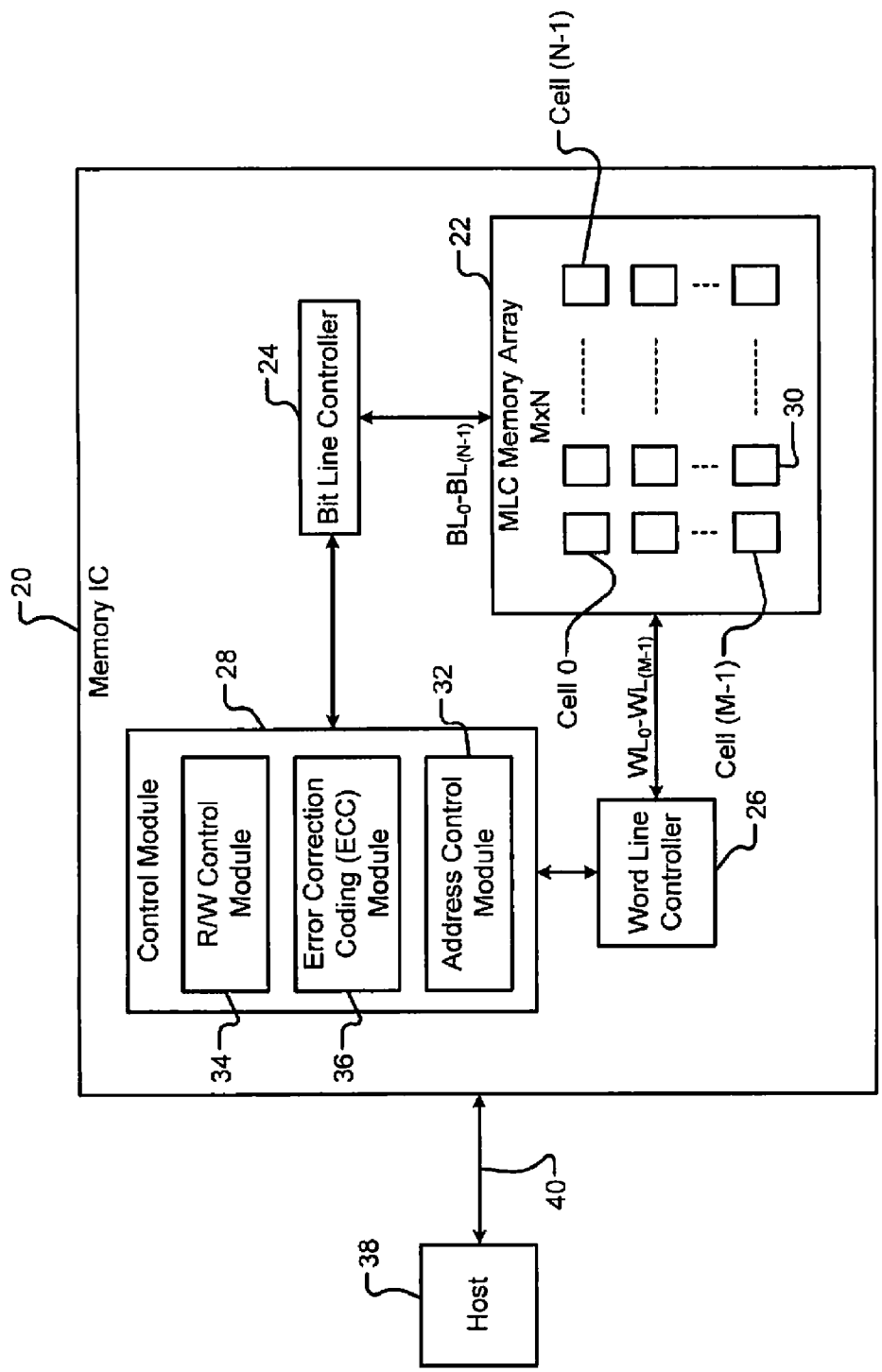
FIG. 2 is a functional block diagram of an example of a memory integrated circuit (IC) according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Errors that occur when reading from multi-level memory cells (MLCs) are primarily due to "minimum-distance error events." Minimum-distance error events refers to an incorrect neighboring voltage state being detected instead of a stored voltage state in an MLC. For example, a neighboring voltage state in an MLC may be a state with the next nearest voltage level. For example only, in a two-bit MLC that includes four possible voltage states ($1^{st}$, $2^{nd}$, $3^{rd}$, and $4^{th}$), the neighboring states to the $2^{nd}$ state include the $1^{st}$ state and the $3^{rd}$ state. Minimum-distance error events occur because voltage level thresholds between voltage states are used during read operations. Therefore, noise during a read operation may cause a read voltage to rise above a nearby voltage threshold.

Figure 3A:
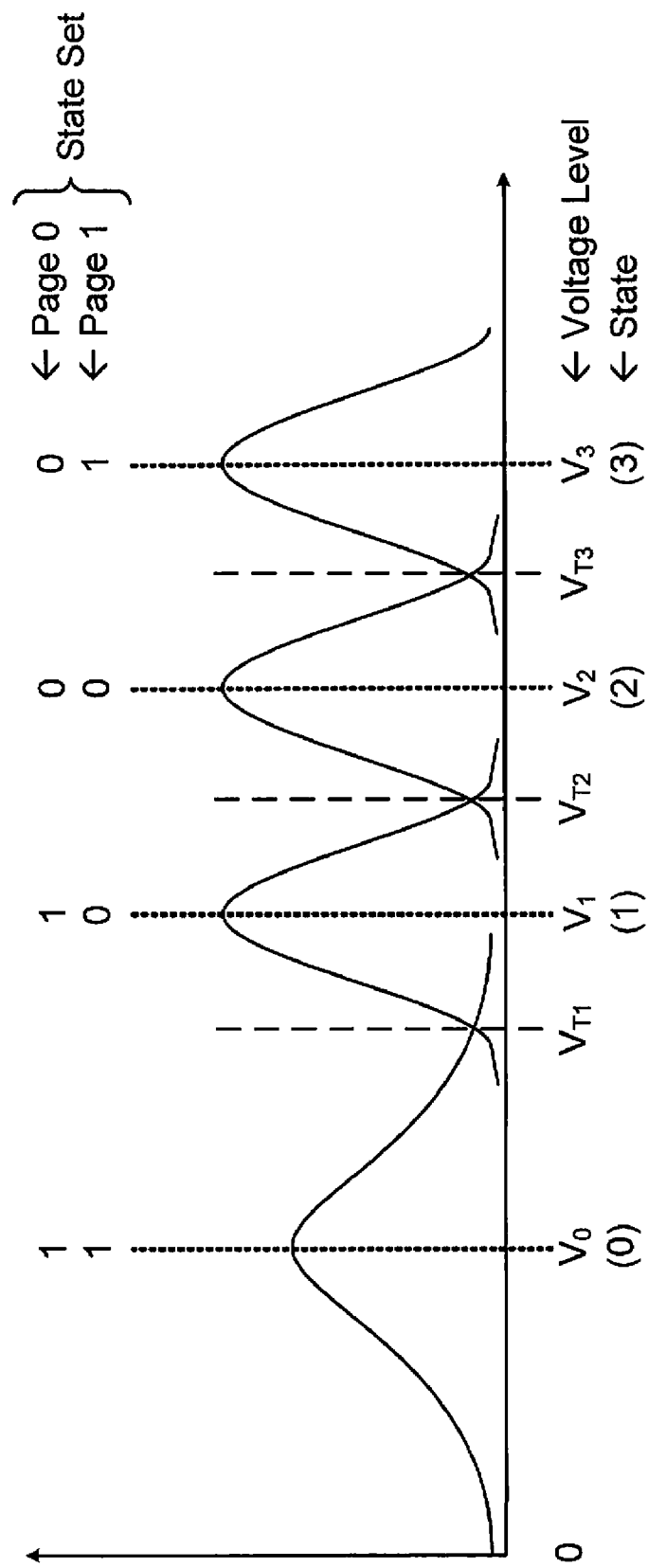
FIG. 3A is a schematic diagram illustrating various voltage states of a MLC and an assignment to data sequences, according to the present disclosure.

Referring now to FIG. 3A, a voltage state diagram illustrates voltage levels corresponding to states of a two-bit MLC, and an assignment of different data sequences (i.e., data pairs) to the states of the two-bit MLC. In the example of FIG. 3A, a first voltage level $V_0$ corresponds to a first state (0) of the MLC, and data sequence "11" is assigned to the first state (0). A second voltage level $V_1$ corresponds to a second state (1) of the MLC, and data sequence "10" is assigned to the second state (1). A third voltage level $V_2$ corresponds to a third state (2) of the MLC, data sequence "00" is assigned to the third state (2). Lastly, a fourth voltage level $V_3$ corresponds to a fourth state (3) of the MLC, and data sequence "01" is assigned to the fourth state (3).

As shown in FIG. 3A, the voltage levels may be related to each other as follows:

$$V_0 < V_1 < V_2 < V_3.$$

In one embodiment, the voltage levels $V_0$, $V_1$, $V_2$, and $V_3$ may be applied to the MLC during a write operation to write states (0), (1), (2), and (3), respectively. Thus, a state may be selectively written to the MLC depending on which state is assigned to represent a corresponding data sequence. For example, a particular assignment of data sequences to corresponding states of an MLC may be referred to as a "state set."

As previously mentioned, voltage level thresholds may be used during a read operation to determine which state is stored in the MLC. More specifically, a first voltage threshold $V_{T1}$ may correspond to a transition between states (0) to (1) in the MLC. A second voltage threshold $V_{T2}$ may correspond to a transition between states (1) to (2) in the MLC. Lastly, a third voltage threshold $V_{T3}$ may correspond to a transition between states (2) to (3) in the MLC. In other words, a voltage stored in the MLC may be read and compared to the voltage level thresholds to determine a state that was stored in the MLC.

The voltage level thresholds may be related to each other and to the voltage levels as follows:

$$V_0 < V_{T1} < V_1 < V_{T2} < V_2 < V_{T3} < V_3.$$

Relationships between the various states of the MLC and corresponding data sequences (assigned to the states) may be summarized below in Table 1:

TABLE 1

| MLC State | (0) | (1) | (2) | (3) | |
|---|---|---|---|---|---|
| Data | 1 | 0 | 0 | 1 | Page 0 (MSB) |
|  | 1 | 1 | 0 | 0 | Page 1 (LSB) |

When pages (bits) in neighboring states of a state set are the same, the probability of error for the page due to a minimum-distance error event may be zero. In other words, when the neighboring bits are the same, a minimum-distance error event that results in a neighboring state being read instead of the stored state may not result in an error (i.e., the same bit is read either way).

However, when pages (bits) in neighboring states of the state set are different, the probability of error due to a minimum-distance error may increase. Therefore, a probability of error for a page in a state set, hereinafter referred to as a bit error rate, may be based on a number of state transitions (STs) between the bits in neighboring states of the state set. In other words, referring again to Table 1, page 0 includes two state transitions—i.e., there is a first state transition between bits corresponding to states 0 and 1 and a second state transition between bits corresponding to states 2 and 3. Page 1, however, includes only one state transition—i.e., a single state transition between bits corresponding to states 1 and 2. Therefore, the bit error rate for page 0 is greater than the bit error rate of page 1.

Thus, if the state set shown in FIG. 3A and in Table 1 is applied along an entire word line of MLCs, the bit error rate for page 0 may be much greater then the bit error rate of page 1. This may be problematic because conventional error correction coding (ECC) systems use a common code for processing all the pages of a word line. For example, the common code may be designed for to process a "worst-case" bit error rate.

However, because the error statistics in a word line of MLCs may vary from page to page (as shown above), processing all the pages of a word line with the same ECC may result in uncorrected errors (if under-designed) or additional costs and/or complexity (if over-designed). These uncorrected errors at the output of a memory system may result in read failure errors. Therefore, in general, conventional MLC memory systems may include higher read failure rates than similar size single-level cell (SLC) memory systems.

One solution is to process each page with a different ECC code. However, this solution may be complex and/or costly for both design and implementation. Therefore, systems and methods are presented that distribute bit error rates equally between pages in a word line of MLCs, thus allowing for application of the same ECC code to each page of a word line. The application of the same ECC code may reduce system complexity required to meet a desired data reliability.

Figure 3B:
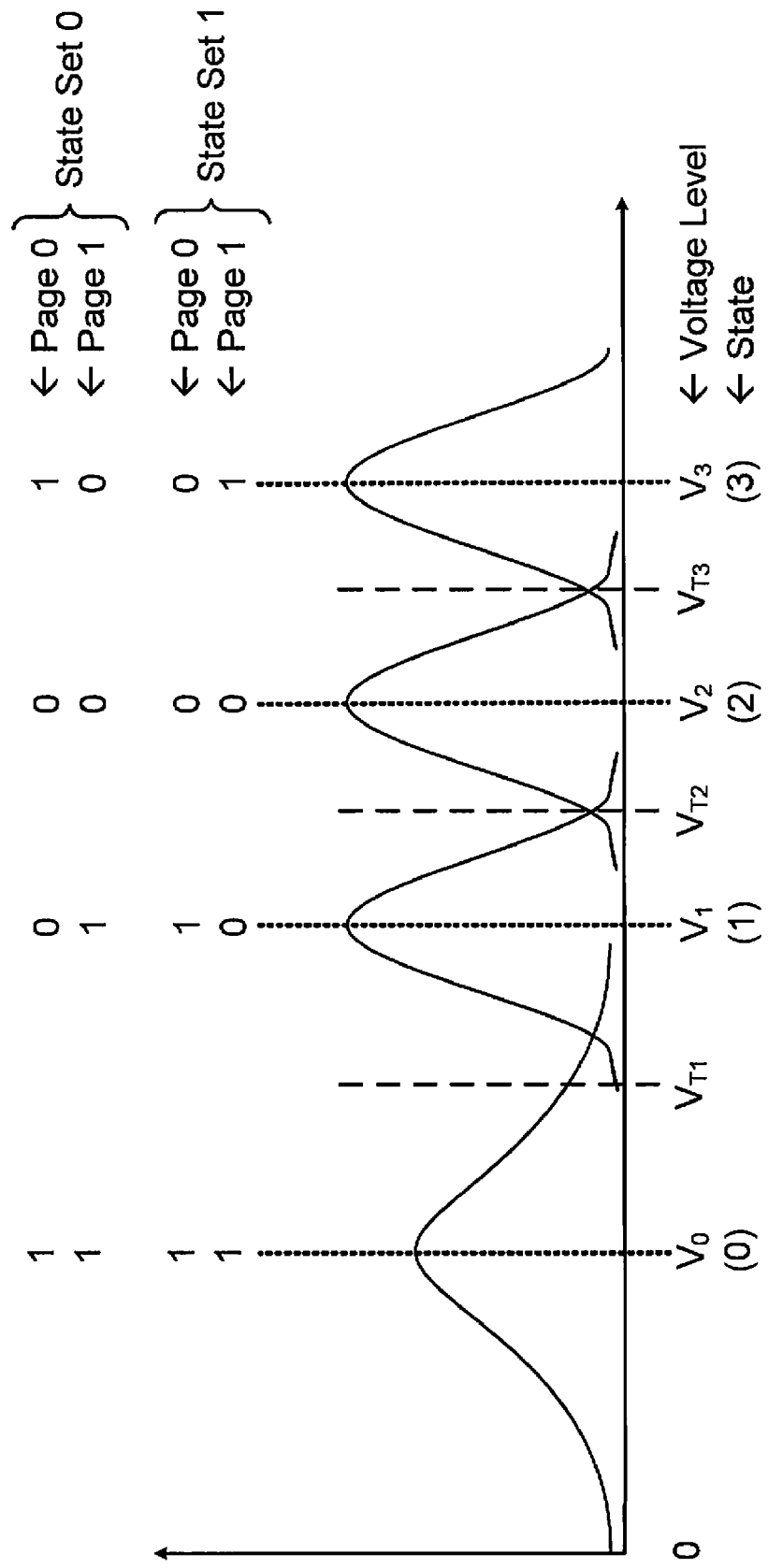
FIG. 3B is a schematic diagram illustrating various voltage states of a MLC and two different assignments to data sequences, according to the present disclosure.

Referring now to FIG. 3B, a voltage state diagram illustrates voltage levels corresponding to states of a two-bit MLC, and two different sets of data sequences (i.e., data pairs) that are assigned to the states of the two-bit MLC. In other words, the states of the MLC are assigned to data sequences according to two different state sets. State set 0 is the same assignment as previously seen in FIG. 3A. However, an additional state set (hereinafter referred to as state set 1) is different than state set 0. Relationships between state set 0, state set 1, and corresponding data sequences assigned to each of the states are summarized in Table 2 below:

TABLE 2

| MLC State | (0) | (1) | (2) | (3) | | |
|---|---|---|---|---|---|---|
| State Set 0 | 1 | 0 | 0 | 1 | Page 0 (MSB) → | 2 ST |
|  | 1 | 1 | 0 | 0 | Page 1 (LSB) → | 1 ST |
| State Set 1 | 1 | 1 | 0 | 0 | Page 0 (MSB) → | 1 ST |
|  | 1 | 0 | 0 | 1 | Page 1 (LSB) → | 2 ST |

Thus, while state set 0 includes higher error statistics for page 0 than for page 1 (2 state transitions vs. 1 state transition, for each bit position), state set 1 includes higher error statistics for page 1 than for page 0 (2 state transitions vs. 1 state transition, for each bit position). Therefore, state set 0 and state set 1 may be implemented an equal number of times when writing data pairs along a word line of MLCs to achieve equal error statistics for both page 0 and page 1. In other words, an average error statistic along the word line may be between one and two state transitions (i.e., 1.5) per MLC.

For example, state set 0 and state set 1 may be implemented alternatively when writing data pairs along the word line of MLCs. Thus, for each bit in page 0 and page 1, the number of state transitions are shown below:

Page 0→[1, 2, 1, 2, 1, 2, . . . ]→9 ST.
Page 1→[2, 1, 2, 1, 2, 1, . . . ]→9 ST.

As shown above, there are 9 state transitions for page 0 bits and 9 state transitions for page 1 bits. Therefore, (depending on the length of the word line) page 0 and page 1 include approximately equal bit error rates. In other words, state set 1 may be referred to as a "cyclic shift" of state set 0 because the pages in state set 0 and state set 1 are reversed (i.e., shifted up/down). To further illustrate the benefits of distributing the bit error rates equally between the pages, resulting numbers of state transitions using only state set 0 (i.e., FIG. 3A) are shown below:

Page 0→[1, 1, 1, 1, 1, 1, . . . ]→6 ST.
Page 1→[2, 2, 2, 2, 2, 2, . . . ]→12 ST.

Thus, an ECC code to process the bit error rates above may require a more complex ECC code to handle the increased (i.e., worst-case) bit error rate of page 1 (12 state transitions). Alternatively, applying an ECC code to page 1 that is designed to process the lower bit error rate of page 0 (9 state transitions) may result in uncorrectable errors when reading data from page 1, and thus may increase read failure rates in the MLC memory system.

Figure 4:
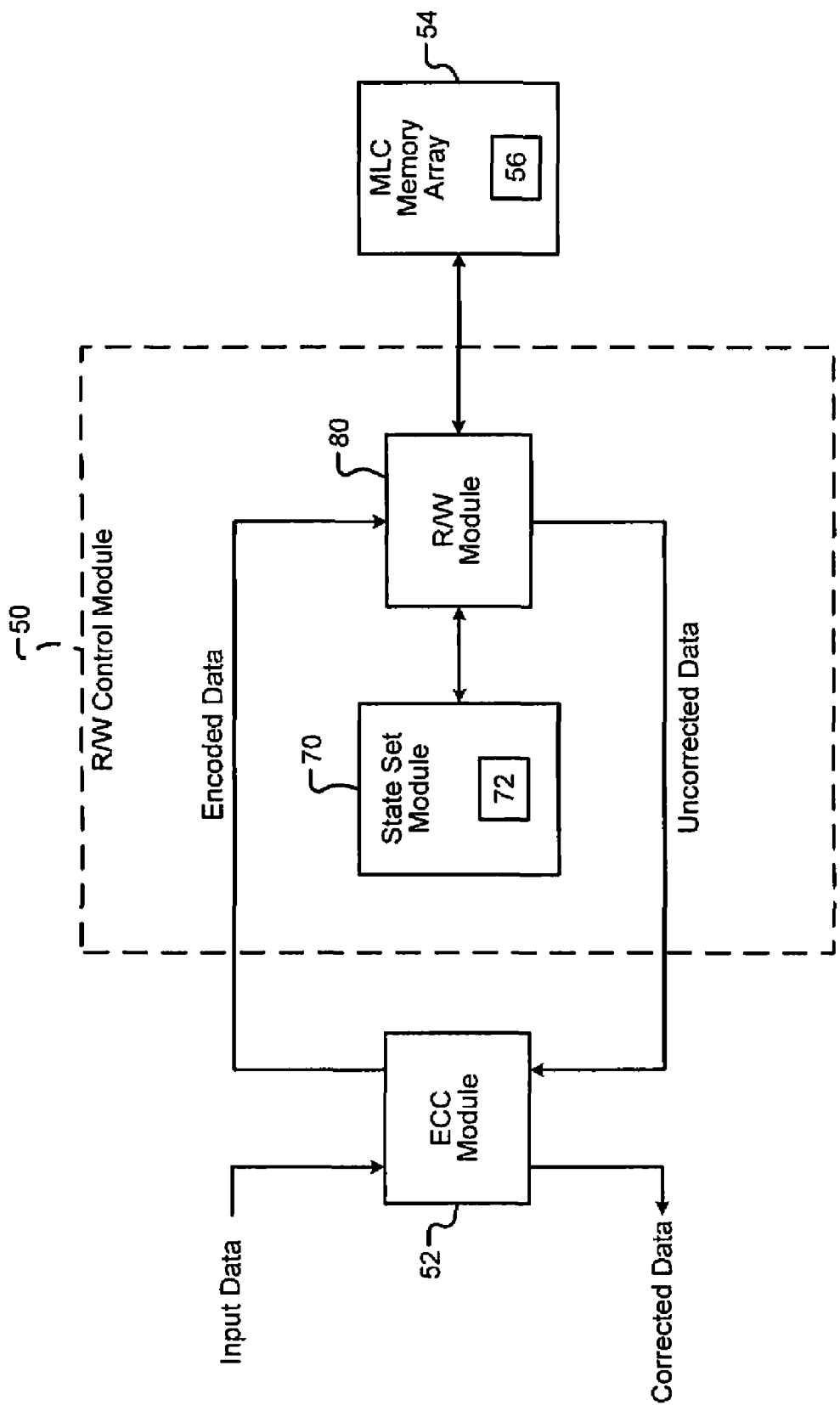
FIG. 4 is a functional block diagram of a read/write (R/W) control module according to the present disclosure.

Referring now to FIG. 4, a read/write (RAN) control module 50 according to the present disclosure is shown. The R/W control module 50 may communicate with an ECC module 52 and a MLC memory array 54. The MLC memory array 54 includes a plurality of MLC cells 56. In one implementation, the RAN control module 50 may communicate with the MLC memory array 54 via an address control module (not shown), a bit line controller (not shown), and a word line controller (not shown). The R/W control module 50 may also include a state set module 70 that includes a memory map module 72, and a R/W module 80. In one embodiment, the R/W module 80 may be implemented as two separate modules—a write module and a read module.

The ECC module 52 may receive input data sequences (e.g., a stream of data bits) to be written to the MLC memory array 54. The ECC module 52 may generate encoded data sequences based on the input data sequences and a predetermined ECC. In one implementation, the ECC module 52 may encode the input data sequences to decrease system bit error rates. For example, the predetermined ECC may include a Reed-Solomon code or a Bose, Ray-Chaudhuri, Hocquenghem (BCH) code.

The R/W module 80 may receive the encoded data sequences from the ECC module 52. The encoded data sequences may include pages of data bits. For example, the pages of data bits may be:

Page 0[1, 0, 0, 1, 1, 1, 0, 1, 1, 1, . . . ].
Page 1[1, 1, 1, 1, 1, 0, 0, 1, 0, 0, . . . ].

The R/W module 80 may generate bit pairs corresponding to logical data for each of the MLCs 56. For example, the pages of data bits (above) may be grouped as follows:

$$\begin{array}{cccccccccc} 0 & 1 & 2 & 3 & 4 & 5 & 6 & 7 & 8 & 9\ MLC\# \end{array}$$

$$\left[ \binom{1}{1}\binom{0}{1}\binom{0}{1}\binom{1}{1}\binom{1}{1}\binom{1}{0}\binom{0}{0}\binom{1}{1}\binom{1}{0}\binom{1}{0}(\ldots) \right],$$

where each pair of bits is to be stored in one of the MLCs 56.

The R/W module 80 may communicate with the state set module 70. In one embodiment, the R/W module 80 may send a request to the state set module 70, and receive state sets from the state set module 70 to be used during a write operation.

The state set module 70 may provide two or more state sets so that the same bits (e.g., MSBs) among the different state sets have the same bit error rates as other bits (e.g., LSBs) among the different state sets. In one implementation, the state set module 70 includes a plurality of state sets that are selectable by the R/W module 80. For example, the state set module 70 may provide a base state set (state set 0) and at least one other state set (state set 1). For example, the state set module 70 may provide the following state sets (as previously seen in FIG. 3B) as seen below in Table 3:

TABLE 3

| MLC States | (0) | (1) | (2) | (3) | | |
|---|---|---|---|---|---|---|
| State Set 0 | 1 | 0 | 0 | 1 | Page 0 → | 2 ST |
|  | 1 | 1 | 0 | 0 | Page 1 → | 1 ST |
|  |  |  |  |  | Total | 3 ST |
| State Set 1 | 1 | 1 | 0 | 0 | Page 0 → | 1 ST |
|  | 1 | 0 | 0 | 1 | Page 1 → | 2 ST |
|  |  |  |  |  | Total | 3 ST |

Referring again to FIG. 3, the R/W module 80 may write states to the MLCs 56 from the two or more state sets. For example, the R/W module 80 may determine a state set to use, then may determine which state in the state set corresponds to an encoded data sequence to be written, and then may write the determined state. In one embodiment, the R/W module 80 may write states from state set 0 and state set 1, alternating between state set 0 and state set 1 along a word line.

For example, the R/W module 80 may alternatively write states from state set 0 and state set 1 corresponding to the input data sequences (i.e. the bit pairings) previously described. Thus, the states written to the cells along the word line may be seen in Table 4:

TABLE 4

| Input Data | 1 | 0 | 0 | 1 | 1 | 1 | 0 | 1 | 1 | 1 | Page 0 |
|---|---|---|---|---|---|---|---|---|---|---|---|
|  | 1 | 1 | 1 | 1 | 1 | 0 | 0 | 1 | 0 | 0 | Page 1 |
| State Set (S0/S1) | S0 | S1 | S0 | S1 | S0 | S1 | S0 | S1 | S0 | S1 |  |
| Written States | (0) | (3) | (1) | (0) | (0) | (1) | (2) | (0) | (3) | (1) |  | when alternating between writing states from state set 0 and from state set 1.

Thus, the states written from the state sets in the alternating pattern results in equal error probabilities (i.e., worst-case error statistics) along each page of the word line. Therefore, the same ECC methodology may later be applied to each page, which may result in decreased bit error rates, reduced complexity, and/or reduced costs of design.

More specifically, the R/W module 80 may read incorrect states from the MLC memory array 54. In one embodiment, the incorrect states read from the MLC memory array 54 may include errors due to minimum-distance error events. The R/W module 80 may then generate data sequences that include errors due to the incorrect states.

The ECC module 52 may receive the data sequences that include errors from the R/W module 80. The ECC module 52 may correct errors in the data sequences using a same ECC code for each page of the data sequences. For example, the ECC code may be based on the predetermined ECC code.

Figure 5:
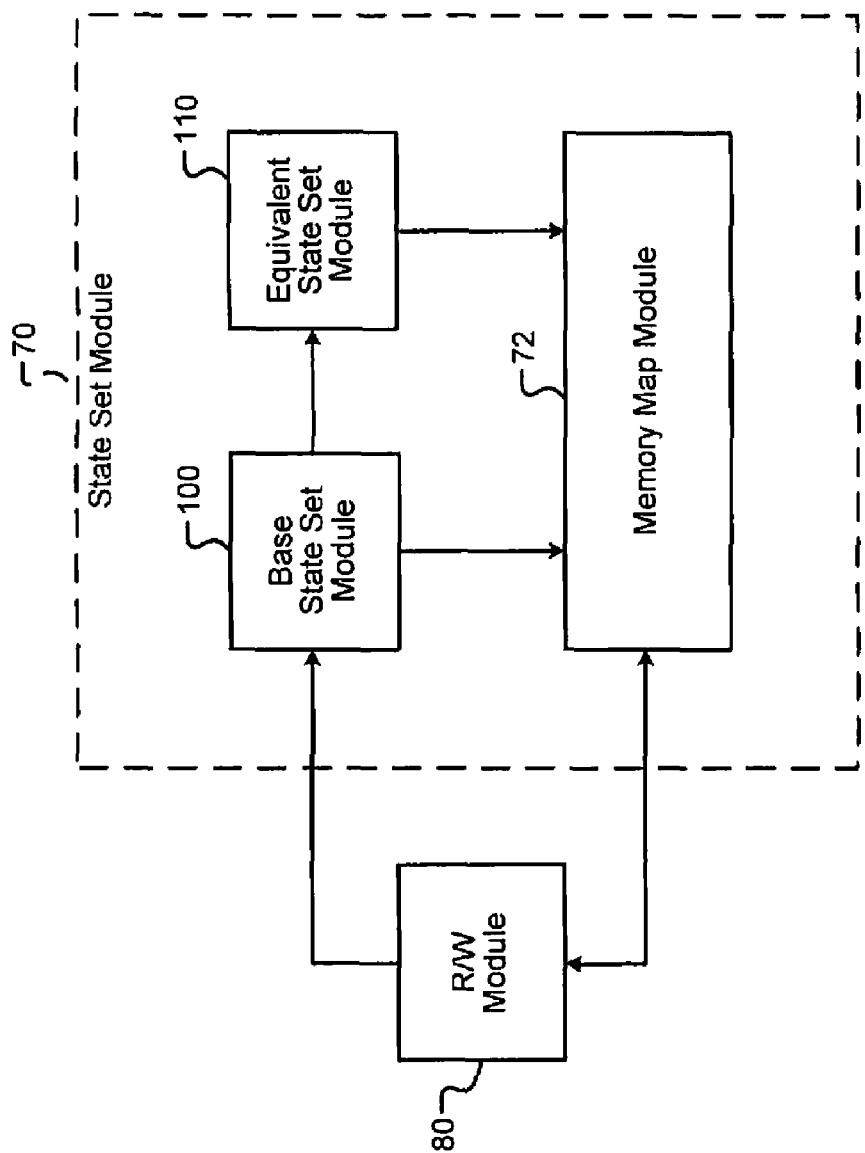
FIG. 5 is a functional block diagram of a state set module according to the present disclosure.

Referring now to FIG. 5, the state set module 70 is shown in more detail. The state set module 70 may communicate with the R/W module 80. The state set module 70 may include a base state set module 100, an equivalent state set module 110, and the memory map module 72. In one embodiment, the base state set module 100 includes a plurality of base state sets and the equivalent state set module 110 includes a plurality of equivalent state sets corresponding to the plurality of base state sets. In another embodiment, the memory map module 72 includes a plurality of mapping patterns to be used when writing to a word line of MLCs.

The base state set module 100 may receive a signal from the R/W module 80 corresponding to a request for state sets during a write operation. The base state set module 100 may provide a base state set that includes a predetermined number of state transitions. For example, the base state set module 100 may provide a base state set based on a Gray code. A Gray code may include an incrementing binary sequence where only one bit may transition at a time.

The equivalent state set module 110 receives the base state set from the base state set module 100. The equivalent state set module 110 provides additional state sets based on the base state set. The additional state sets may be referred to as "equivalent state sets" because each may include an equal number of state transitions as the base state set. For example, the equivalent state set module 110 may provide equivalent state sets based on cyclic shifts of the base state set. In other words, for example, a cyclic shift may shift the states of a state set such that the equivalent state set having an equal number of state transitions but different state assignments. For example only, a cyclic shift may include shifting pages of the state sets up or down.

The memory map module 72 receives the base state set and the equivalent state sets. The memory map module 72 may communicate with the R/W module 80. More specifically, the R/W module 80 may access the base state set and the equivalent state sets according to a memory map for use during a write operation. In other words, the memory module 72 may store a pattern of the state sets used during a write operation, such as alternating between the state sets. Additionally, the R/W module 80 may access the memory map used during a write operation for use in a corresponding read operation.

Figure 6A:
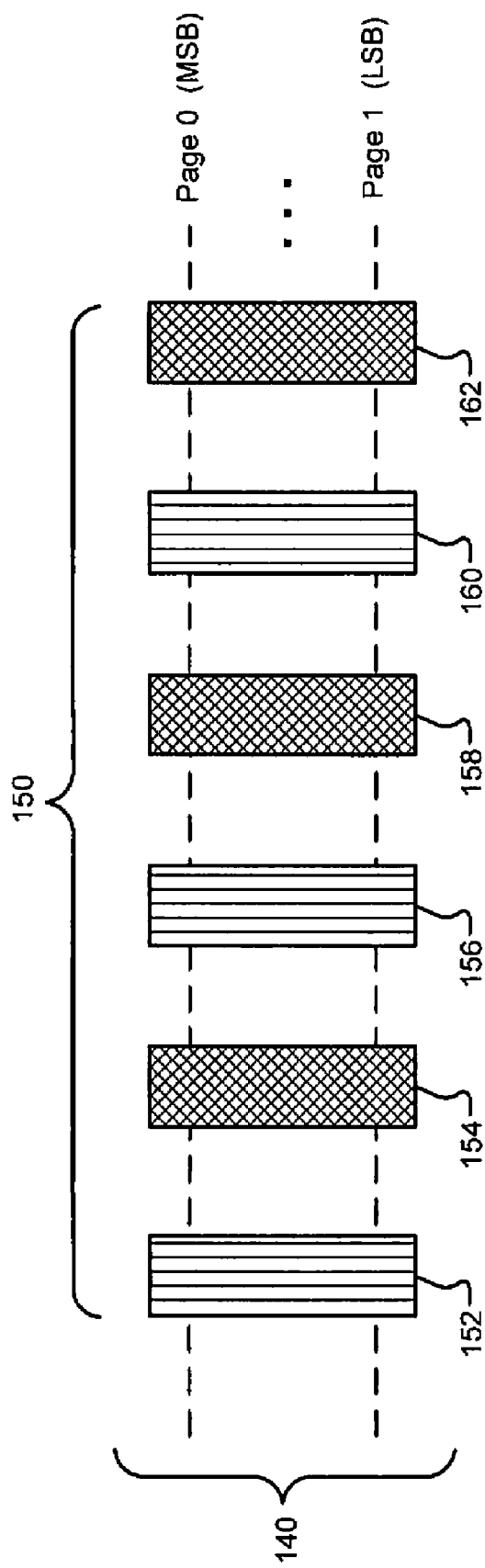
FIG. 6A is a schematic diagram illustrating a first method of writing states to MLCs along a word line, according to the present disclosure.
Figure 6B:
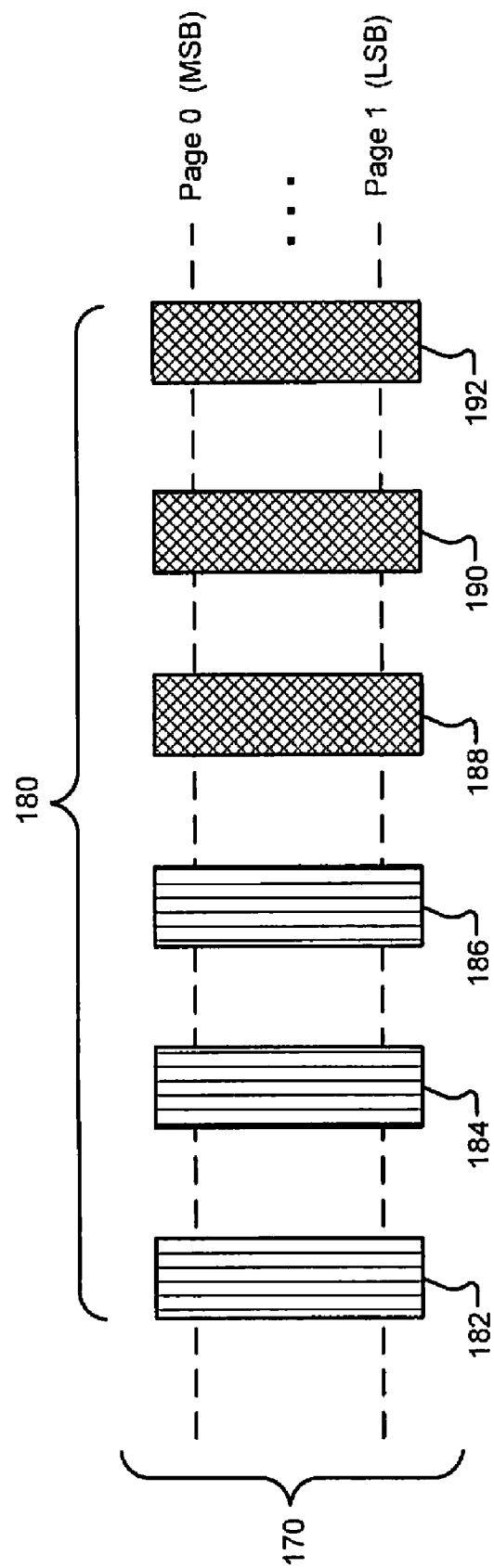
FIG. 6B is a schematic diagram illustrating a second method of writing states to MLCs along a word line, according to the present disclosure.

Referring now to FIGS. 6A and 6B, exemplary methods of writing states to a word line of MLCs according to the present disclosure are shown. For purposes of simplicity, state set 0 and state set 1 (previously described) may be used again:

TABLE 5

| MLC States | (0) | (1) | (2) | (3) | | |
|---|---|---|---|---|---|---|
| State Set 0 | 1 | 0 | 0 | 1 | Page 0 → | 2 ST |
|  | 1 | 1 | 0 | 0 | Page 1 → | 1 ST |
| State Set 1 | 1 | 1 | 0 | 0 | Page 0 → | 1 ST |
|  | 1 | 0 | 0 | 1 | Page 1 → | 2 ST |

In FIG. 6A, state set 0 and state set 1 may be accessed alternatively when writing states to MLCs 150 along a word line 140. In one implementation, MLCs 152, 156, and 160 may be written with states from state set 0, and MLCs 154, 158, and 162 may be written with states from state set 1.

In FIG. 6B, state set 0 and state set 1 may each be accessed an equal number of times when writing states to MLCs 180 along a word line 170 (i.e., in the case of two state sets, a 50/50 distribution). In other words, MLCs 182, 184, and 186 may be written with states from state set 0, and MLCs 188, 190, and 192 may be written with states from state set 1.

In another embodiment, a third sample write operation may be illustrated for three-bit MLCs 56 using three state sets. The state sets may include, for example, a base state set (state set 0) based on Gray code and two equivalent state sets (state set 1 and state set 2) based on cyclic shifts of the base state set. The state sets and corresponding numbers of state transitions for each page are shown below in Table 6:

TABLE 6

| MLC State | (0) | (1) | (2) | (3) | (4) | (5) | (6) | (7) | |
|---|---|---|---|---|---|---|---|---|---|
| State Set 0 | 1 | 1 | 1 | 1 | 0 | 0 | 0 | 0 | Page 0 → 1 ST |
|  | 1 | 1 | 0 | 0 | 0 | 0 | 1 | 1 | Page 1 → 2 ST |
|  | 1 | 0 | 0 | 1 | 1 | 0 | 0 | 1 | Page 2 → 4 ST |
| State Set 1 | 1 | 0 | 0 | 1 | 1 | 0 | 0 | 1 | Page 0 → 4 ST |
|  | 1 | 1 | 1 | 1 | 0 | 0 | 0 | 0 | Page 1 → 1 ST |
|  | 1 | 1 | 0 | 0 | 0 | 0 | 1 | 1 | Page 2 → 2 ST |
| State Set 2 | 1 | 1 | 0 | 0 | 0 | 0 | 1 | 1 | Page 0 → 2 ST |
|  | 1 | 0 | 0 | 1 | 1 | 0 | 0 | 1 | Page 1 → 4 ST |
|  | 1 | 1 | 1 | 1 | 0 | 0 | 0 | 0 | Page 2 → 1 ST |

As shown in Table 7, each page includes seven total state transitions between the three state sets (e.g., page 0 includes 1 ST for state set 0, 4 ST for state set 1, and 2 ST for state set 2). Furthermore, it can be seen that state set 1 is a cyclic shift of state set 0 (rows shifted down one) and that state set 2 is a cyclic shift of state set 1 (rows shifted down one).

States from the state sets may be written based on an equivalent distribution of the three state sets between MLCs along a word line. In other words, a first third of the input data sequences may be written with states from state set 0, a second third of the input data sequences may be written with states from state set 1, and a last third of the input data sequences may be written with states from state set 2.

Therefore, state transitions for page 0, page 1, and page 2 may be illustrated below:

|  | S0 | S1 | S2 | Total |
|---|---|---|---|---|
| State Transitions for Page 0 = | 1 + 1 + | 4 + 4 + | 2 + 2 = | 14 |
| State Transitions for Page 1 = | 2 + 2 + | 1 + 1 + | 4 + 4 = | 14 |
| State Transitions for Page 2 = | 4 + 4 + | 2 + 2 + | 1 + 1 = | 14 | where S0 represents MLCs written with states from state set 0, S1 represents MLCs written with states from state set 1, and S2 represents MLCs written with states from state set 2.

In other words, the error statistics are equally distributed between each page of the word line (i.e., 14 state transitions per page). Therefore, the ECC module 52 may process each page using the same ECC methodology, resulting in decreased bit error rates at the output of the memory IC 20.

Figure 7:
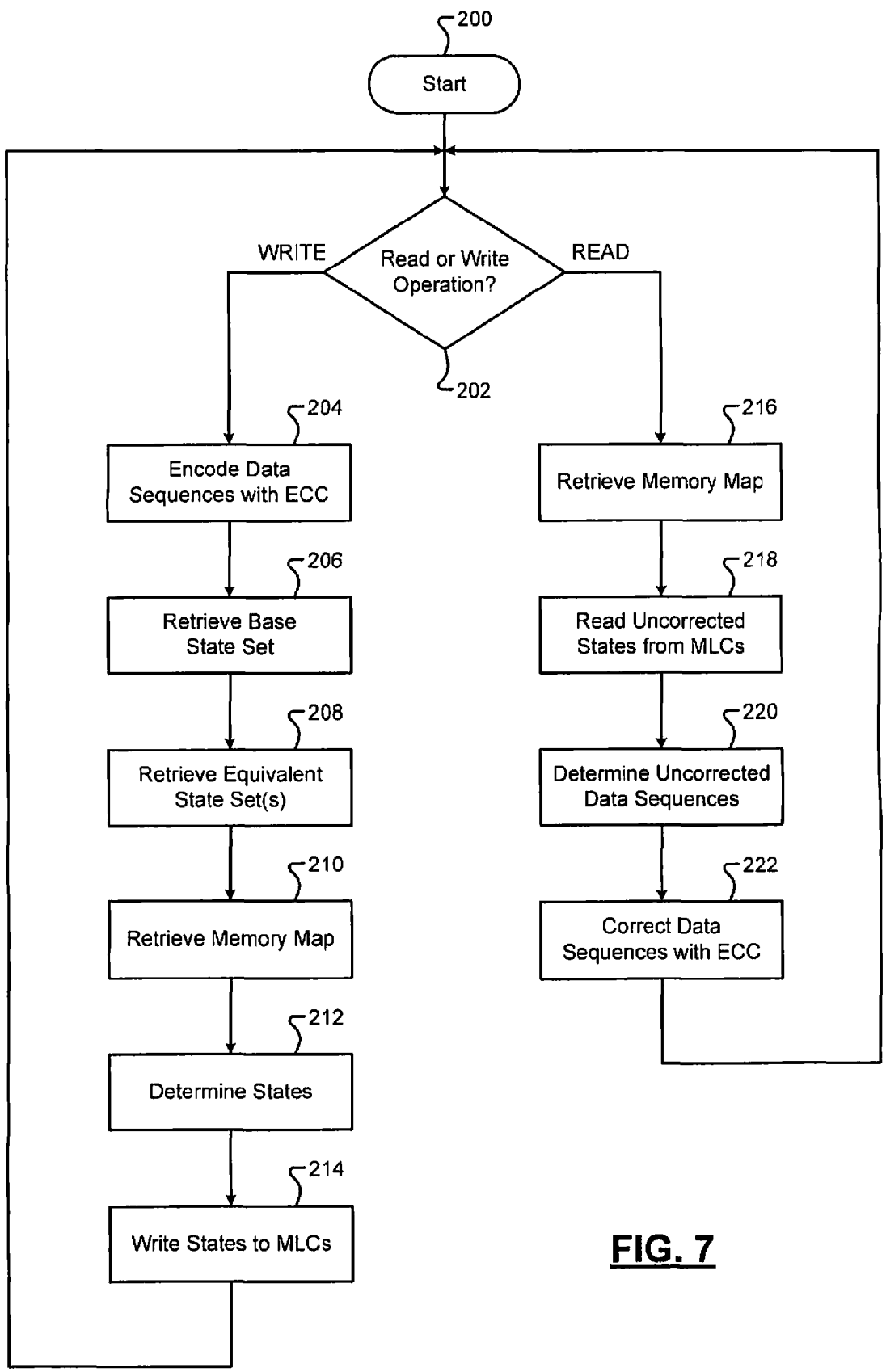
FIG. 7 is a block diagram that illustrates a method for decreasing bit error rates (BERs) in the memory IC circuit, according to the present disclosure.

Referring now to FIG. 7, a method for improving bit error rates at the output of a memory IC system begins in step 200. In step 202, a R/W control module (e.g., R/W control module 50) determines whether a read or a write operation is requested. If a write operation is requested, control may proceed to step 204. If a write operation is requested, control may proceed to step 206.

In step 204, an ECC module (e.g., ECC module 52) may encode input data sequences (e.g., an input data stream) using a predetermined ECC.

In step 206, the R/W control module may retrieve a base state set from a base state set module (e.g., base state set module 100). In one embodiment, the base state set may be based on a Gray code. In step 208, the R/W control module may retrieve equivalent state sets from an equivalent state set module (e.g., equivalent state set module 110). In one implementation, the equivalent state sets may be based on cyclic shifts of the base state set (which may be based on a Gray code).

In step 210, the R/W control module may retrieve a memory map from a memory map module (e.g., memory map module 72) corresponding to implementation of the base state set and the equivalent state sets for use in both a current write operation and future read operations.

In step 212, the R/W control module may determine which states from the base state set and the equivalent state sets to use during the current write operation. More specifically, the R/W control module may determine the states to write based on the encoded data sequences and the memory map. For example, the memory map may be alternating between the base state set and the equivalent state sets along the word line.

In step 214, the R/W control module may write the states to a MLC memory array (e.g., MLC memory array 54). In one implementation, the R/W control module may write one state per cell along a word line of the MLC memory array. Control may then return to step 202.

In step 216, the RAN control module may access the base state set and the equivalent state sets to determine data written during a previous write operation. For example, the R/W control module may read states of each of the cells of the MLC memory array according to the base state set, the equivalent state sets, and the memory map from the memory map module.

In step 218, the R/W control module may read state information from the cells along the word line of the MLC memory array. In other words, the R/W control module may read states from the cells that may be incorrect due to minimum-distance error events.

In step 220, the RAN control module may generate uncorrected data sequences. For example, the R/W control module may generate the uncorrected data sequences based on the uncorrected states, the base state set, the equivalent state sets, and the memory map.

In step 222, the ECC module may correct errors in the uncorrected data sequences based on the predetermined ECC. Control may then return to step 202.

The broad teachings of the disclosure can be implemented in a variety of forms—e.g., techniques described above can also be implemented for memory integrated circuits (ICs) of three or more dimensions (e.g., memories having a three dimensional memory cell array structure). The techniques are also applicable to nano memory integrated (ICs). Therefore, while this disclosure includes particular examples, the true scope of the disclosure should not be so limited since other modifications will become apparent upon a study of the drawings, the specification, and the following claims.

What is claimed is:

1. A memory system comprising:
a state set module configured to provide
a first state set having a first plurality of states,
wherein each of the first plurality of states includes a first bit and a second bit,
wherein a first error rate is associated with a first page including the first bit of each of the first plurality of states, and
wherein a second error rate is associated with a second page including the second bit of each of the first plurality of states; and
a second state set having a second plurality of states,
wherein each of the second plurality of states includes a first bit and a second bit,
wherein the second error rate is associated with a third page including the first bit of each of the second plurality of states, and
wherein the first error rate is associated with a fourth page including the second bit of each of the second plurality of states; and a write module configured to
write a third plurality of states to a plurality of multi-level memory cells on a wordline,
wherein each of the third plurality of states includes a first bit and a second bit,
wherein a first set of the plurality of multi-level memory cells is written using states selected from the first plurality of states,
wherein a second set of the plurality of multi-level memory cells is written using states selected from the second plurality of states, and
wherein a fifth page including the first bit of each of the third plurality of states has a same error rate as a sixth page including the second bit of each of the third plurality of states.

2. The memory system of claim 1, further comprising:
a read module configured to
read the first set of the plurality of multi-level memory cells based on the first state set; and
read the second set of the plurality of multi-level memory cells based on the second state set.

3. The memory system of claim 1, wherein each of the first plurality of states of the first state set corresponds to a threshold voltage level.

4. The memory system of claim 1, wherein each of the first plurality of states of the first state set is assigned to represent a particular data sequence in accordance with a Gray mapping.

5. The memory system of claim 4, wherein an assignment of particular data sequences among the states of the second state set is in accordance with a Gray mapping.

6. The memory system of claim 1, further comprising an error correction code (ECC) module configured to encode first data and second data prior to writing the first data and the second data respectively to the first set of the plurality of multi-level cells and the second set of the plurality of multi-level cells.

7. The memory system of claim 6, wherein the plurality of multi-level cells includes NOR flash memory cells or a NAND flash memory cells.

8. A method comprising:
providing a first state set having a first plurality of states, wherein each of the first plurality of states includes a first bit and a second bit, wherein a first error rate is associated with a first page including the first bit of each of the first plurality of states, and wherein a second error rate is associated with a second page including the second bit of each of the first plurality of states;
providing a second state set having a second plurality of states, wherein each of the second plurality of states includes a first bit and a second bit, wherein the second error rate is associated with a third page including the first bit of each of the second plurality of states, and wherein the first error rate is associated with a fourth page including the second bit of each of the second plurality of states; and
writing a third plurality of states to a plurality of multi-level memory cells on a wordline,
wherein each of the third plurality of states includes a first bit and a second bit, wherein a first set of the plurality of multi-level memory cells is written using states selected from the first plurality of states, wherein a second set of the plurality of multi-level memory cells is written using states selected from the second plurality of states, and wherein a fifth page including the first bit of each of the third plurality of states has a same error rate as a sixth page including the second bit of each of the third plurality of states.

9. The method of claim 8, further comprising:
reading the first set of the plurality of multi-level memory cells based on the first state set; and
reading the second set of the plurality of multi-level memory cells based on the second state set.

10. The method of claim 8, wherein each of the first plurality of states of the first state set corresponds to a threshold voltage level.

11. The method of claim 8, wherein each of the first plurality of states of the first state set is assigned to represent a particular data sequence in accordance with a Gray mapping.

12. The method of claim 11, wherein an assignment of particular data sequences among the states of the second state set is in accordance with a Gray mapping.

13. The method of claim 8, further comprising:
encoding each of first data and second data prior to writing the first data and the second data respectively to the first set of the plurality of multi-level cells and the second set of the plurality of multi-level cells.

14. The method of claim 13, wherein the plurality of multi-level cells includes NOR flash memory cells or NAND flash memory cells.

15. The memory system of claim 1, wherein an error rate associated with the wordline is an average of the first error rate and the second error rate.

16. The method of claim 8, wherein an error rate associated with the wordline is an average of the first error rate and the second error rate.

17. The memory system of claim 1, wherein the first set of the plurality of multi-level memory cells is arranged alternately relative to the second set of the plurality of multi-level memory cells on the wordline.

18. The method of claim 8, wherein the first set of the plurality of multi-level memory cells is arranged alternately relative to the second set of the plurality of multi-level memory cells on the wordline.

* * * * *